United States Patent
Kumar

(10) Patent No.: US 9,891,683 B2
(45) Date of Patent: Feb. 13, 2018

(54) METHODS AND SYSTEMS FOR MEMORY INITIALIZATION OF AN INTEGRATED CIRCUIT

(71) Applicant: Wipro Limited, Bangalore (IN)

(72) Inventor: Kodavalla Vijay Kumar, Bangalore (IN)

(73) Assignee: WIPRO LIMITED, Bangalore (IN)

( * ) Notice: Subject to any disclaimer, the term of this patent is extended or adjusted under 35 U.S.C. 154(b) by 37 days.

(21) Appl. No.: 15/083,829

(22) Filed: Mar. 29, 2016

(65) Prior Publication Data
US 2017/0235352 A1 Aug. 17, 2017

(30) Foreign Application Priority Data
Feb. 15, 2016 (IN) .............................. 201641005277

(51) Int. Cl.
G06F 1/26 (2006.01)
G06F 3/06 (2006.01)
G06F 1/32 (2006.01)

(52) U.S. Cl.
CPC ............ G06F 1/266 (2013.01); G06F 1/3287 (2013.01); G06F 3/0619 (2013.01); G06F 3/0632 (2013.01); G06F 3/0683 (2013.01)

(58) Field of Classification Search
CPC ...... G06F 1/3287; G06F 1/266; G06F 3/0619; G06F 3/0632; G06F 3/0683
See application file for complete search history.

(56) References Cited

U.S. PATENT DOCUMENTS

2004/0260530 A1* 12/2004 Josso .................. G06F 17/5027
703/23

OTHER PUBLICATIONS https://blogs.synopsys.com/breakingthethreelaws/2013/06/upf-fpga-based-prototyping-%E2%80%93-more-power-mick/ , "UPF & FPGA-Based Prototyping—More Power Mick", Jun. 21, 2013, pp. 1-5.
Angela Sutton, "My RTL is an Alien! Accelerating and Automating ASIC to FPGA-Based Prototype Conversion", Sep. 2013, *Synopsys*, pp. 1-14.
Alberto Sangiovanni-Vincentelli, https://www.si2.org/events_dir/2009/PowerForward/LowPowerGuide09232009/pfl_lpg_chapters/lpg_sect1_06052009.pdf, "A Practical Guide to Low-Power Design User Experience with CPF", *Power Forward*, pp. Sec1:1-Sec1:109, 2009.

* cited by examiner

*Primary Examiner* — Austin Hicks
(74) *Attorney, Agent, or Firm* — Finnegan, Henderson, Farabow, Garrett & Dunner, LLP

(57) ABSTRACT

This disclosure relates generally to data processing, and more particularly, to methods and systems for memory initialization of an integrated circuit. In one embodiment, a method for memory initialization at a circuitry is provided. The method comprises: identifying a portion of the circuitry configured as a memory device; detecting a start of a power-off state for a power domain within the circuitry including the memory device; performing a write operation to write data of a pre-determined pattern to the memory device upon detecting the start of the power-off state; and providing the data stored at the memory device for a reading operation after the power-off state ends.

18 Claims, 5 Drawing Sheets

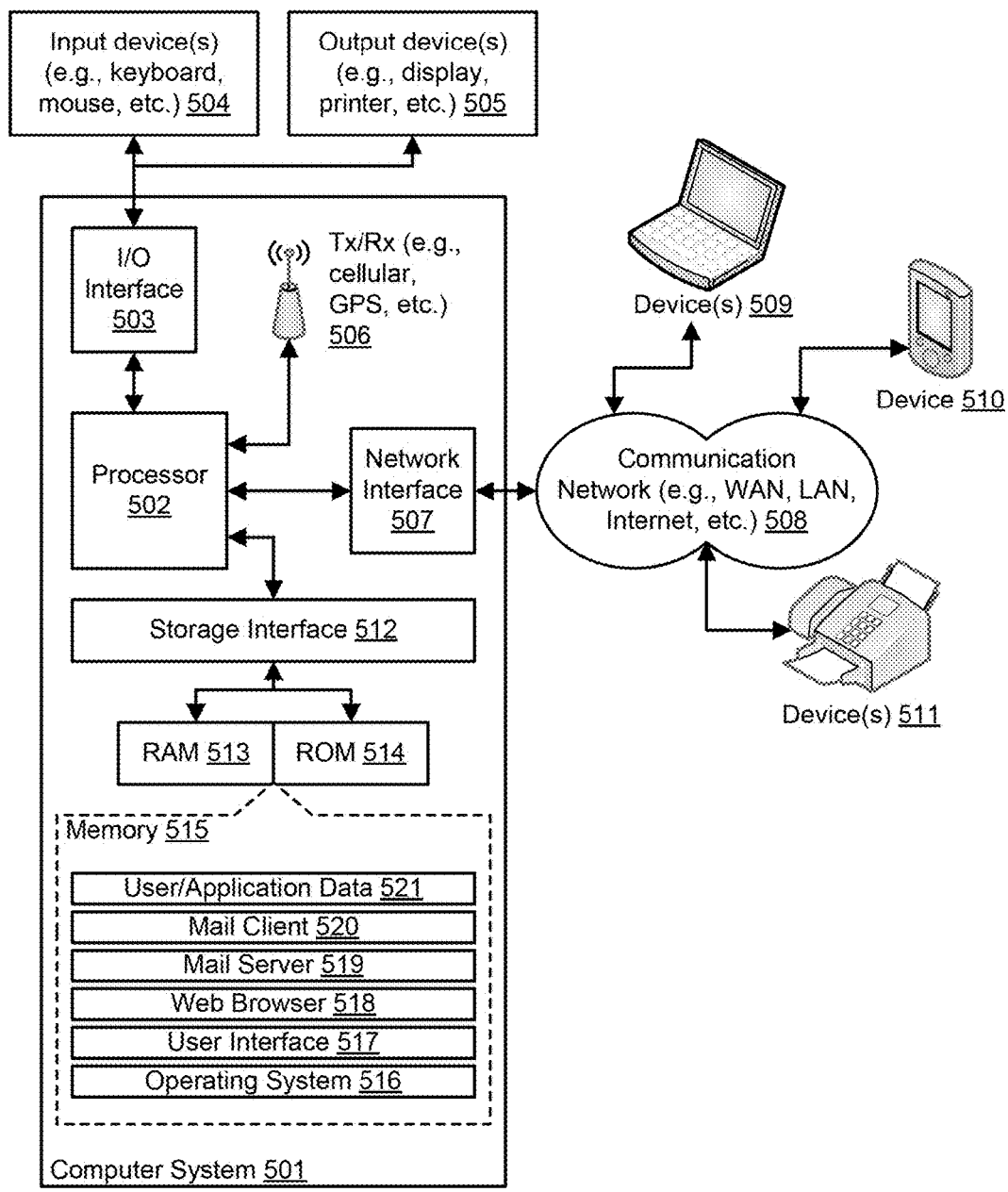
FIG. 5: Example Computer System

METHODS AND SYSTEMS FOR MEMORY INITIALIZATION OF AN INTEGRATED CIRCUIT

TECHNICAL FIELD

This disclosure relates generally to integrated circuit technologies, and more particularly, to methods and systems for memory initialization of an integrated circuit.

BACKGROUND

Nowadays, to achieve low power consumption, an integrated circuit (e.g., Application Specific Integrated Circuit (ASIC), a system-on-chip (SoC) that includes an ASIC, etc.) typically is designed such that portions of the circuit can be selectively powered off based on operational needs. To facilitate selective powering on and off, such an integrated circuit can comprise a plurality of power domains, where circuits associated with a certain power domain can be powered off independently from circuits associated with another power domain.

FIG. 1A illustrates an example of an integrated circuit 100 with multiple power domains. As shown in FIG. 1A, integrated circuit 100 also includes memory block 112 and logic block 114 organized under a power domain 116, memory 122 block and logic block 124 organized under a power domain 126, and memory block 132 and logic block 134 organized under a power domain 136. Memory blocks 112, 122, and 132 can include any kind of on-chip memory such as, for example, static random access memory (SRAM). Logic blocks 114, 124, and 134 can include any kind of circuitry such as, for example, Complementary metal oxide semiconductor (CMOS) circuits.

Integrated circuit 100 also includes a power management unit (PMU) 102, which can also include CMOS circuits and can individually enable (or disable) each of power domains 116, 126, and 136. A power domain enters a power-on state when enabled, and enters a power-off state when disabled. Each of power domains 116, 126, and 136 can be selectively coupled with a voltage rail 150, which can be configured as a power supply. PMU 102 can selectively enable (or disable) the power supply to a particular power domain, by setting a power disable signal (not shown in FIG. 1A) to a certain voltage level. As an illustrative example, when a power disable signal reaches a voltage level that represents a logical "zero," the power domain coupled with that power disable signal can be enabled.

When the power supply to a power domain is disabled under a power management scheme, the memory and logic blocks of that power domain can also exhibit certain behaviors. For example, the data written in the memory block just prior to the disabling of the power domain will become erased when the power domain is disabled. When the power supply to that power domain is enabled again, before any data is written in the memory block, the initial data in the memory block can be of certain patterns. For example, the initial data in the memory block, after the power domain is enabled, can be all logical "ones" or all "zeros."

Moreover, the logic blocks can also be controlled to exhibit certain behaviors when the power supply to the associated power domain is disabled under the power management scheme. For example, as shown in FIG. 1A, each power domain can be coupled with a local reset signal and an isolation enable signal. The local reset signal can be configured to set a logic state of some types of logics (e.g., sequential logic, such as flip-flop and latch) to a certain pre-defined state, when the power domain is in the power-off state. The isolation enable signal can be configured to enable one or more isolation cells ("ISO cells") associated with the power domain. The ISO cells can set a logic state of an input to at least some of the logics (which can include both sequential logic and combination logic) when the power supply to the power domain is disabled. With such an arrangement, the logic state of the logic blocks 114, 124, and 134, when the power supply to the associated power domains are disabled, can become defined, which can minimize the likelihood of unexpected behavior of these logic blocks when their associated power domains transits from a power-off state to a power-on state.

Typically, as shown in FIG. 1B, the isolation enable operation and reset operation at a power domain occur during a power-off sequence, when the power supply to the power domain is still enabled (e.g., where the power disable signal has a low logic state), and the logic blocks of that power domain are still supplied with power. Once the power-off sequence completes, power disable signal can then transit to a high logic state to disable the power supply to the power domain.

Referring back to FIG. 1A, integrated circuit 100 can also receive a system reset signal 152 and a system clock 154. System reset signal 152 can be a signal configured to set all the logics of integrated circuit 100 to one or more logic states. System reset signal 152 typically resets integrated circuit 100 when it is powered up, and is typically inactive when individual power domains enter a power-off state. System clock 154 can be a signal that toggles at a predetermined frequency (e.g., 10 MHz). System clock 154 can be configured to synchronize the operations of some of the logics (e.g., sequential logics) and the memory block among and within the power domains. System clock 154 can also be used by PMU 102 to synchronize the generation of the isolation enable signal, the local reset signal, and the power disable signal. Further, each of power domains 116, 126, and 136 can include a local clock that can be selectively coupled with the system clock 154. PMU 102 can couple a local clock of a power domain to the system clock 154, when the power domain is enabled, and can decouple the local clock from the system clock 154 when the power domain is disabled. When the local clock is decoupled from the system clock 154, it can stop toggling, and power consumption due to switching power can be further reduced. In some cases, the coupling and decoupling of the local clock signal from the system clock 154 can be based on the power disable signal of FIG. 1B.

Some of the behaviors of integrated circuit 100 can be emulated using a field programmable gate array (FPGA), for prototyping and/or validating an ASIC design. An FPGA typically includes an array of programmable logic blocks, which typically includes a set of look-up tables, flip flops, memory blocks, and routing matrices that can be configured, using a hardware description language (HDL) such as VHDL, Verilog, etc., to implement certain logic and memory functions. When using the FPGA to prototype an ASIC design, the HDL can be configured to describe the behaviors of certain logic blocks and memory blocks on the ASIC. A software compiler can compile a program file that includes HDL associated with the logic blocks and memory blocks, and generate a set of low level programming instructions. The low level programming instructions can then configure the set of look-up tables, flip flops, memory blocks, and routing matrices of a FPGA to implement the logic and memory functions of those logic and memory blocks. The configured FPGA can then be operated under a certain operation condition (e.g., being provided with a certain combination of input signals) to generate an output. The output of the FPGA can then be compared with the expected output of the ASIC design. The comparison result can then be used to validate an ASIC design, and to improve the likelihood that that when an ASIC is fabricated according to the design, the fabricated ASIC will generate the expected output under that operation condition.

The inventors here have recognized several technical problems with the conventional method of using FPGA to emulate the behavior of an integrated circuit. For example, under the current state of technologies, the programmable logic blocks in an FPGA cannot be individually, under user control, powered on or powered off (e.g., by selectively decoupling a logic block from a power supply), to emulate the behaviors of an integrated circuit when the power supply to some of the power domains of the integrated circuit are selectively enabled or disabled. For example, referring to FIG. 1B, when an actual ASIC receives a certain combination of logic values of isolation enable signal, reset, and power disable configured to disable the power supply to a certain power domain (e.g., when isolation enable signal and the power disable are logical "one" and the reset is a logical "zero"), the data previously stored in a memory block of that power domain will be erased (and replaced with a specific pattern, such as all "ones" or "zeros") as a result of being decoupled from the power supply. However, in the case of a FPGA, the content of an emulated memory block will not be erased by selectively decoupling a power domain from the power supply, since FPGA does not enable such a decoupling. As a result, when emulating a scenario where an ASIC power domain transits from a power-off state to a power-on state, the initial data in an emulated memory block in an FPGA, at a time when the power domain is enabled, can be different from the initial data in an ASIC memory block under the same operation condition, which can lead to inaccurate validation and prototyping.

SUMMARY

Embodiments of the present disclosure present technological improvements as solutions to the above-mentioned technical problems, among others.

For example, in one embodiment, a method for memory initialization at a circuitry is provided. The method comprises: identifying a portion of the circuitry configured as a memory device; detecting a start of a power-off state for a power domain within the circuitry including the memory device; performing a write operation to write data of a pre-determined pattern to the memory device upon detecting the start of the power-off state; and providing the data stored at the memory device for a reading operation after the power-off state ends.

In another embodiment, a non-transitory computer-readable medium that stores a set of programming instructions is provided. The set of programming instructions configure an integrated circuit to perform a method for memory initialization at the integrated circuit, the method comprising: identifying a portion of the integrated circuit configured as a memory device; detecting a start of a power-off state for a power domain within the integrated circuit including the first memory device; performing a write operation to write data of a pre-determined pattern to the memory device upon detecting the start of the power-off state; and providing the data stored at the first memory device for a reading operation after the power-off state ends.

In yet another embodiment, an integrated circuit comprising a plurality of transistors is provided. The integrated circuit is configured to: identify a portion of the integrated circuit configured as a memory device; detect a start of a power-off state for a power domain within the integrated circuit including the memory device; perform a write operation to write data of a pre-determined pattern to the memory device upon detecting the start of the power-off state; and provide the data stored at the memory device for a reading operation after the power-off state ends.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

FIG. 5 is a block diagram of an exemplary system for implementing embodiments consistent with the present disclosure.

DETAILED DESCRIPTION

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims.

Illustrative embodiments of the present disclosure are listed below. In one embodiment, a method for memory initialization at a circuitry is provided. The method comprises: identifying a portion of the first circuitry configured as a first memory device; detecting a start of a power-off state for a power domain within the first circuitry including the first memory device; performing a write operation to write data of a pre-determined pattern to the first memory device upon detecting the start of the power-off state; and providing the data stored at the first memory device for a reading operation after the power-off state ends.

With embodiments of the present disclosure, when emulating a power management operation, a predetermined pattern of data can be written into an emulated memory block of a power domain in an FPGA when the power domain in a power-off state. As a result, when emulating a scenario where an ASIC power domain transits from a power-off state to a power-on state, the initial data in an emulated memory block in an FPGA, at a time when the power domain is enabled, can be identical to the initial data in an ASIC memory block under the same operation condition, which can improve the accuracy of validation and prototyping. Although the specification describes the embodiments using power domain emulation on an FPGA as an example, it is appreciated that the disclosed embodiments are not limited to FPGA, or even to emulation, and can be implemented in any integrated circuit where memory content initialization is desirable.

Figure 1A:
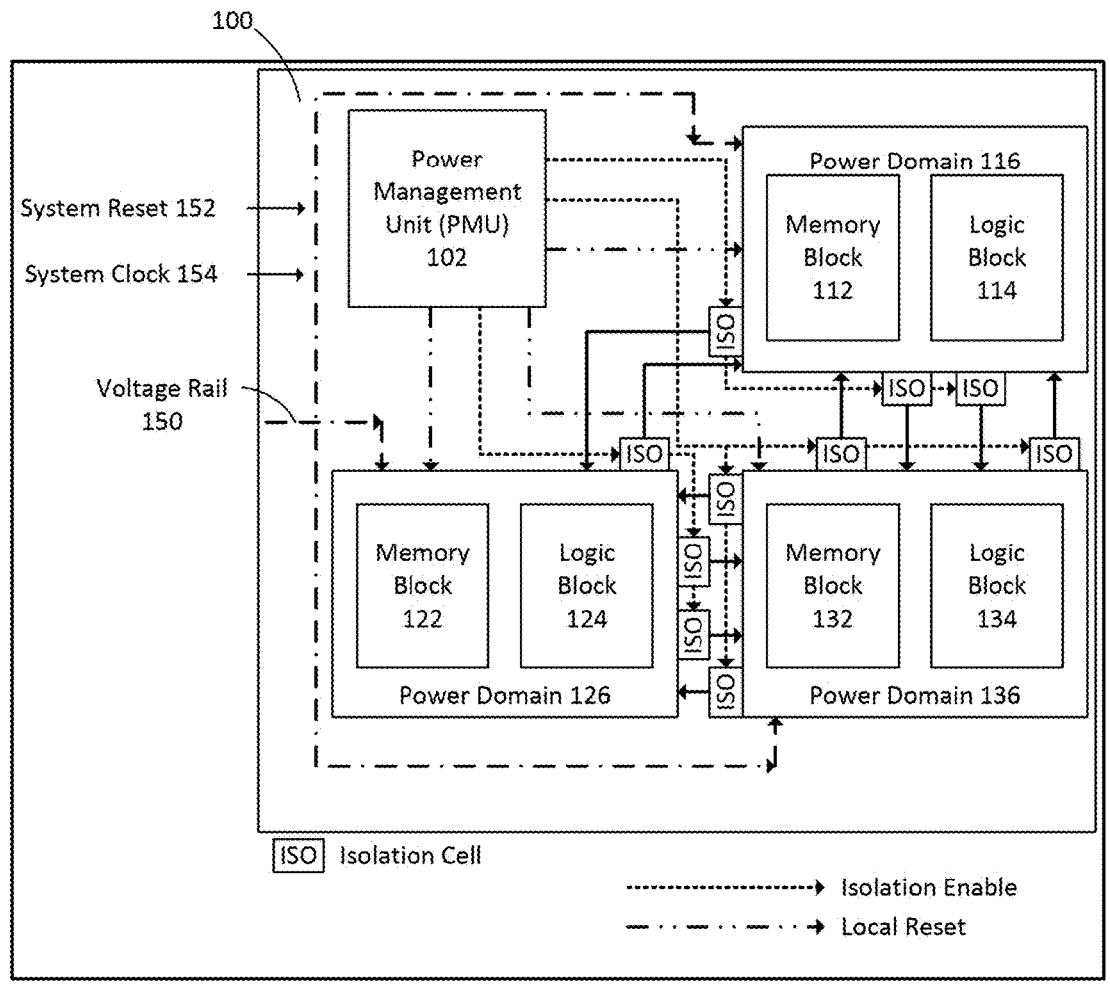
FIGS. 1A and 1B illustrate a conventional power management scheme.
Figure 1B:
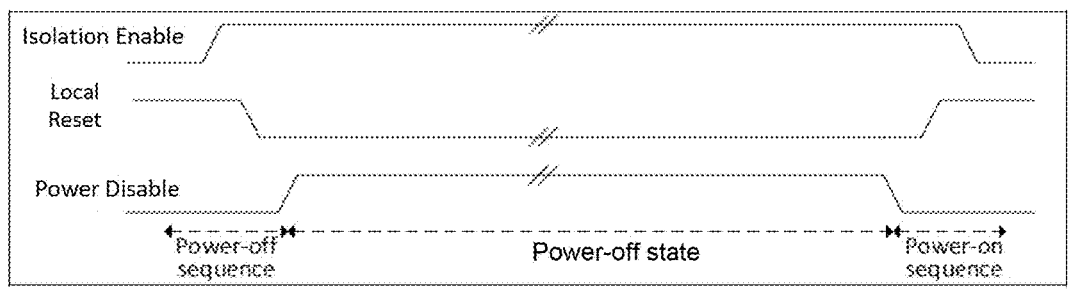
Figure 2:
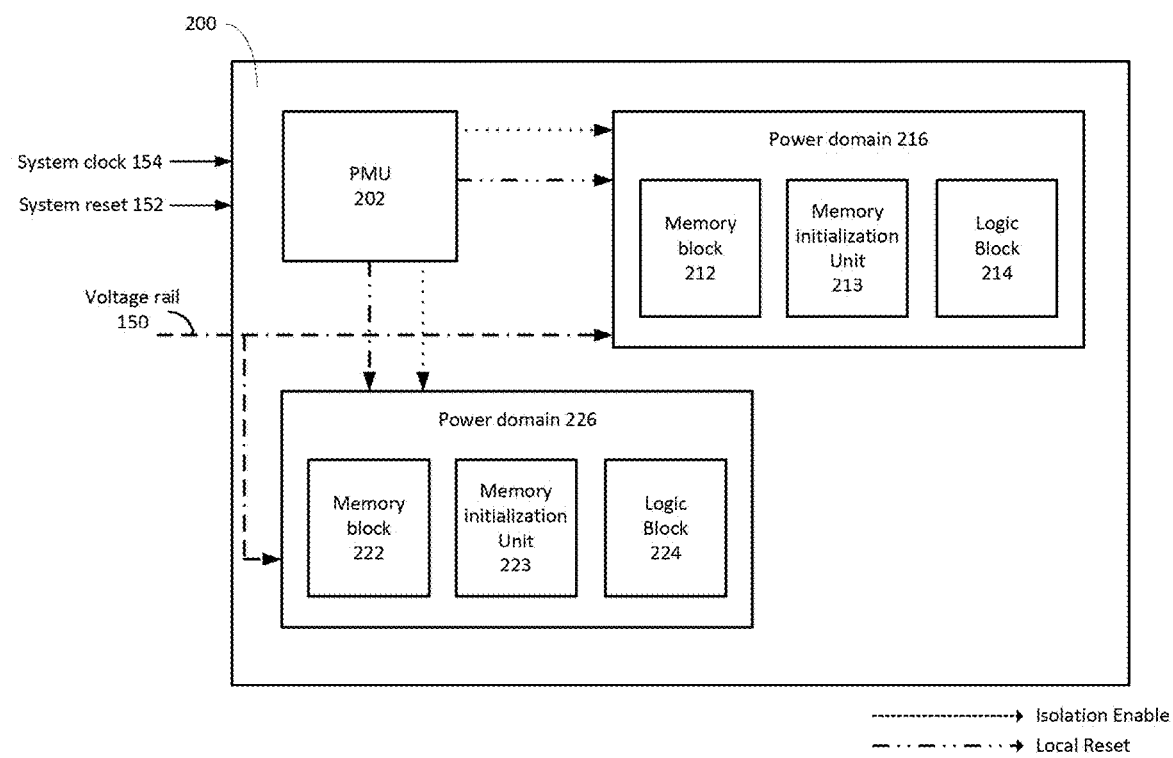
FIG. 2 illustrates an exemplary system for a memory initialization operation, according to embodiments of the present disclosure.

FIG. 2 illustrates an exemplary integrated circuit 200 for a memory initialization operation, according to some embodiments of the present disclosure. In some embodiments, integrated circuit 200 can be a FPGA configured to emulate at least some the behaviors of integrated circuit 100 of FIG. 1, and the memory initialization operation can be performed by integrated circuit 200 when emulating the power management scheme of integrated circuit 100. However, it is also appreciated that integrated circuit 200 can also be an ASIC, and the memory initialization operation can be performed for purposes other than emulation of a power management scheme.

As shown in FIG. 2, integrated circuit 200 includes a PMU 202, and power domains 216 and 226. Power domain 216 includes a memory block 212, a memory initialization unit 213, and a logic block 214, while power domain 226 includes a memory block 222, a memory initialization unit 223, and a logic block 224. Each power domain also includes one or more isolation cells (not shown in FIG. 2). Memory blocks 212 and 222 can include any kind of on-chip memory such as, for example, static random access memory (SRAM). Memory blocks 212 and 222 can include a dual-port memory, in which separate ports are provided for read and write operations, and/or a single-port memory, in which the same port is provided for read and write operations. PMU 202, memory initialization units 213 and 223, as well as logic blocks 214 and 224, can include any kind of circuitry such as, for example, CMOS circuits. Each of the power domains 216 and 226 can be coupled with voltage rail 150.

In some embodiments, integrated circuit 200 can be generated using hardware description language (HDL) such as VHDL, Verilog, etc. A software compiler can compile a program file that includes HDL associated with the PMU, the memory initialization units, the memory blocks, and the logic blocks, and generate a set of low level programming instructions. In some embodiments, the HDL language instructions associated with the memory initialization unit can be added to the program file by an Electronic Design Automation (EDA) tool. The low level programming instructions can be used to configure the look-up table, routing matrices, memory blocks, and flip-flops of a FPGA to implement the logic and memory functions of the PMU, the memory initialization units, the memory blocks, and the logic blocks. The low level programming instructions can also be used by synthesis tools to generate netlist information for ASIC fabrication.

In some embodiments, PMU 202 can generate an isolation enable signal, a local reset signal, and a power disable signal configured to cause a power domain to enter a power-off state. These signals can be generated based on system clock signal 154. As to be discussed below, at least one of the isolation enable signal, the local reset signal, and the power disable signal can also cause the memory initialization units 213 and 223 to write a predetermined pattern of data into, respectively, memory blocks 212 and 222, when the power domains 216 and 226 is in a power-off state but are still coupled with voltage rail 150. This can happen when integrated circuit 200 is a FPGA configured to emulate the behavior of a power domain transitioning between a power-off state and a power-on state. Integrated circuit 200 can also receive system reset 152 which can reset integrated circuit 200 when it is powered up.

Figure 3:
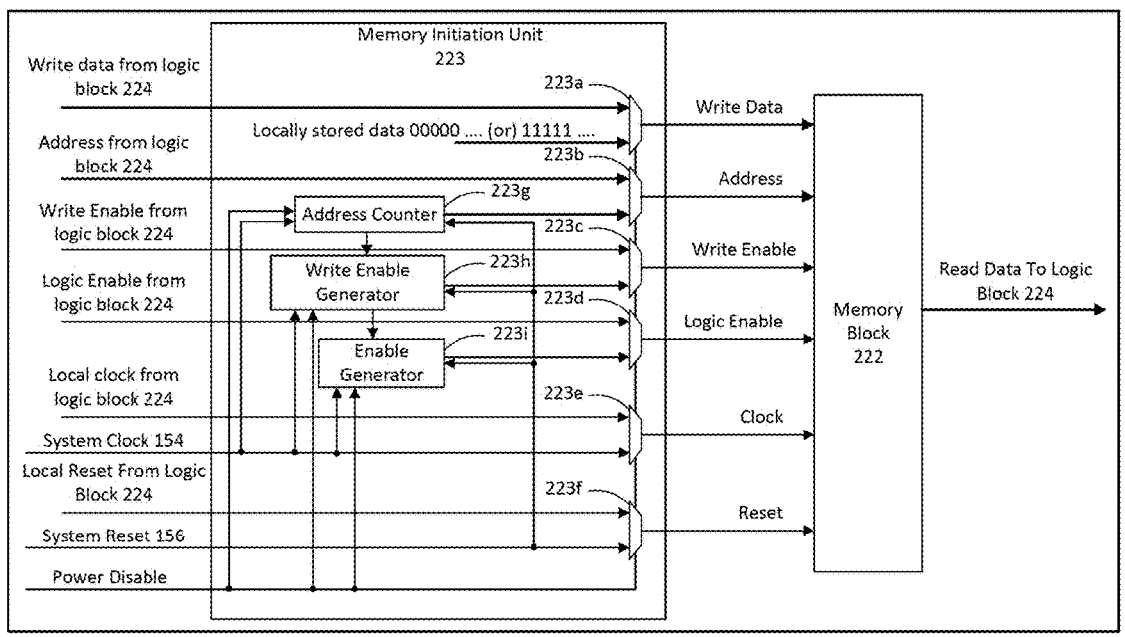
FIG. 3 illustrates the block diagram of an exemplary memory initialization unit of FIG. 2, according to embodiments of the present disclosure.

FIG. 3 illustrates the block diagram of memory initiation unit 223 of FIG. 2, according to embodiments of the present disclosure. As shown in FIG. 3, memory initiation unit 223 may include multiplexers 223a-223f, an address counter 223g, a write enable generator 223h, and an enable generator 223i.

In some embodiments, multiplexers 223a-223f can be configured to selectively couple or decouple memory block 222 from logic block 224. Typically memory block 222 can receive a number of signals from logic block 224 to perform a write operation. For example, as shown in FIG. 3, memory block 222 can receive write data to be written into a certain location with the memory block, and an address which indicates the location within the memory block for writing the data. Memory block 222 can also receive a write enable signal that configures the memory block for a write operation, as well as a logic enable signal that enables the rest of the memory block circuitries. Memory block 222 can also receive a clock signal and a reset signal for the operation of some of the sequential logics circuitries in the memory block (e.g., sequential logics such as flip-flops and latches configured to store received signals, such as address, enable signals, etc.).

Multiplexers 223a-223f can be configured to forward the write data, address, write enable signal, logic enable, clock signal and reset signals received from logic block 224 to memory block 222, or to forward the corresponding signals generated from a different source, thereby decoupling logic block 224 from memory block 222. The configuration of multiplexers can be done via, for example, the power disable signal from PMU 202, such that the multiplexers can couple logic block 224 with memory block 222 during a power-on state, and decouple logic block 224 from memory block 222 during a power-off state. For example, as shown in FIG. 3, during a power-on state, multiplexers 223a-223d can forward write data, address, write enable and logic enable signals supplied from logic block 224 to memory block 222, enabling logic block 224 to write data into memory block 222. On the other hand, during a power-off state, multiplexers 223a-223d can forward locally stored data of all logical zeros or ones as write data, an address generated by address counter 223g, a write enable signal generated by write enable generator 223h, and a logic signal generated by enable generator 223i to memory block 222. Since only memory initialization unit 223 is allowed to write data into memory block 222 during the power-off state, the data stored in the memory block during the transition between the power-off state to the power-on state can become more deterministic.

Further, multiplexer 223e can also be configured to forward a local clock from logic block 224 to memory block 222 during the power-on state, and to forward system clock 154 signal to memory block 222 during the power-off state. As discussed before, a local clock can be decoupled from system clock 154, when the power supply to the associated power domain is disabled. Therefore, during a power-off state, the local clock from logic block 224 may stop toggling. By configuring multiplexer 223e to supply the system clock 154 to memory block 222, the sequential logics of memory block 222 that operates on the clock signal can remain operational during the power-off state, and may not be affected by the decoupling of local clock from system clock 154. Also, as shown in FIG. 3, components of memory initiation unit 223 that operate on a clock signal, such as address counter 223g, write enable generator 223h, and enable generator 223i, can also receive system clock 154.

Furthermore, multiplexer 223f can also be configured to forward a local reset signal from logic block 224 to memory block 222 during the power-on state, and to forward system reset signal 156 to memory block 222 during the power-off state. As discussed before, the local reset signal resets the logic blocks within a power domain when the power domain enters the power-off state, while system reset signal 156 typically remains inactive during the power-off state. To prevent the local reset signal from resetting the memory block 222 circuitry and interfering with the write operation to memory block 222 during the power-off state, multiplexer 223f can be configured to forward the system reset signal 156 to memory block 222 during the power-off state. Also, as shown in FIG. 3, components of memory initiation unit 223 including address counter 223g, write enable generator 223h, and enable generator 223i, can also receive system reset signal 156, to prevent the logical reset signal from interfering with the operation of memory initiation unit 223 during the power-off state.

As discussed before, address counter 223g are configured to generate an address configured to indicate a location within the memory block for writing the predefined data pattern (e.g., all logical zeros or all logical ones). Address counter 223g can receive information about a portion of the memory block to be written with the data pattern (e.g., in the form of an address range of the memory block), and then generate the addresses, sequentially, according to the information. The frequency of generating new addresses can be based on a number of clock cycles spanned by a write operation, while a value of the new address generated can be based on a number of memory locations covered by the write operation. For example, in a case where one write operation to memory block 222 lasts for one cycle of system clock 154 and that each write operation writes data to one memory location, address counter 223g can generate a new address by incrementing the current address by one for every cycle of system clock 154. The write operations can then be performed sequentially with the generated addresses.

Write enable generator 223h and enable generator 223i are configured to generate, respectively, write enable signals and logic enable signals associated with a write operation. The generation of write enable and logic enable signals can be based on various signals such as, for example, power disable signal and the addresses generated by address counter 223g. In some embodiments, both write enable generator 223h and enable generator 223i can be implemented as a finite-state machine with sequential logics elements (e.g., flip flops) configured to store a state, and the write enable and logic enable signals can be generated based on the state. For example, when the power disable signal indicates that the power domain enters the power-off state, both write enable generator 223h and enable generator 223i can enter an enable state to generate the write enable and logic enable signals at certain logic states to enable a write operation to memory block 222. On the other hand, when the address generated by address counter 223g is the last address within the address range for write operation, both write enable generator 223h and enable generator 223i can enter a disable state to generate the write enable and logic enable signals at another logic states to disable the write operation, after the write operation for the last address completes. The sequential logics of both write enable generator 223h and enable generator 223i can operate on system clock 154, and can be reset by system reset signal 156.

In some embodiments, a memory initialization unit can also interface with multiple memory blocks. In such a case, the memory initialization unit can identify which memory block to write, and then perform write operations to that memory block. The identification can be based on various information. For example, the memory initialization unit can receive an instruction from a logic block to perform a write operation to a specific memory block. The memory initialization unit can also identify all of the memory blocks that it interfaces with, and then perform write operation to each of the memory blocks sequentially.

Figure 4:
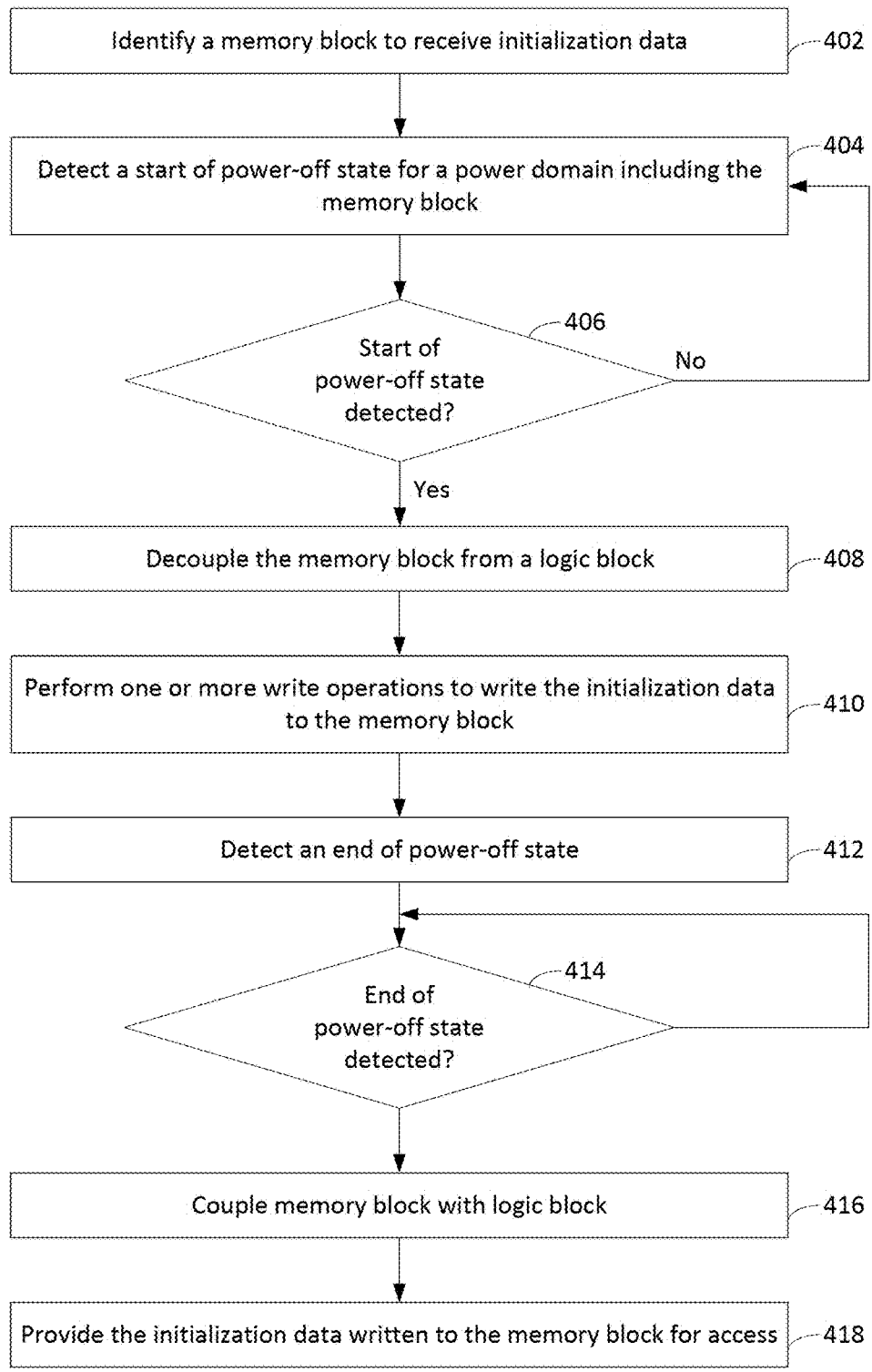
FIG. 4 illustrates an exemplary memory initialization method, according to embodiments of the present disclosure.

FIG. 4 illustrates an exemplary memory initialization method 400, according to embodiments of the present disclosure. In some embodiments, method 400 can be performed by a memory initialization unit, such as memory initialization units 213 and 223 of FIG. 3.

In step 402, the memory initialization unit can identify a memory block to receive initialization data. The identification can be based on, for example, an instruction from a logic block to perform a write operation to a specific memory block. The memory initialization unit can also identify all of the memory blocks that it interfaces with for performing write operation to each of the memory blocks.

In step 404, the memory initialization unit can detect a start of a power-off state for a power domain including the memory block. The detection can be performed based on at least one of: an isolation enable signal, a local reset signal, and a power disable signal provided to the power domain.

If the memory initialization unit detects a start of a power-off state, in step 406, the memory initialization unit can proceed to step 408 to decouple the memory block from a logic block that can be selectively coupled with the memory block. The decoupling can include, for example, configuring one or more circuit components to forward write operation related signals (e.g., write data, address, write enable, and logic enable, etc.) that are generated by memory initialization unit instead of the corresponding write operation related signals generated by the logic block. The decoupling can also include configuring one or more circuit components to forward a system reset signal and a system clock, instead of local reset signal and a local gated clock, to the memory block. In some embodiments, the circuit components being configured can include one or more multiplexers included in the memory initialization unit. On the other hand, if the memory initialization unit does not detect a start of a power-off state, it proceeds back to step 404.

After decoupling the memory block from the logic block in step 408, the memory initialization unit can then proceed to step 410 to perform one or more write operations to write the initialization data to the memory block. The write operation can include, for example, generating write operation related signals such as write data, address, write enable, and logic enable, etc., and forwarding those signals via the aforementioned circuit components (e.g., multiplexers). In some embodiments, the addresses can be generated based on a pre-determined address range of memory block for receiving the initialization data. The write enable and logic enable signals can be generated based on signals that indicate start of power-off state (e.g., power disable), and change in the generated addresses. The initialization data can include a specific pattern, such as all logic ones or all logic zeros.

After the write operations are completed in step 410, the memory initialization unit can detect an end of power-off state. The detection can also be based on at least one of: an isolation enable signal, a local reset signal, and a power disable signal provided to the power domain. After detecting the end of power-off state in step 414, the memory initialization unit can then proceed to step 416 to couple the memory block with the logic block by configuring the aforementioned circuit components (e.g., multiplexers). On the other hand, if the memory initialization unit does not detect an end of the power-off state, it proceeds back to step 414. After coupling the memory block with the logic block in step 416, the memory initialization unit can proceed to step 418 to provide the initialization data written to the memory block for access by, for example, the logic block.

Computer System

FIG. 5 is a block diagram of an exemplary computer system for implementing embodiments consistent with the present disclosure. Variations of computer system 501 may be used for implementing the devices and systems disclosed herein. Computer system 501 may comprise a central processing unit ("CPU" or "processor") 502. Processor 502 may comprise at least one data processor for executing program components for executing user- or system-generated requests. A user may include a person, a person using a device such as those included in this disclosure, or such a device itself. The processor may include specialized processing units such as integrated system (bus) controllers, memory management control units, floating point units, graphics processing units, digital signal processing units, etc. The processor may include a microprocessor, such as AMD Athlon, Duron or Opteron, ARM's application, embedded or secure processors, IBM PowerPC, Intel's Core, Itanium, Xeon, Celeron or other line of processors, etc. The processor 502 may be implemented using mainframe, distributed processor, multi-core, parallel, grid, or other architectures. Some embodiments may utilize embedded technologies like application-specific integrated circuits (ASICs), digital signal processors (DSPs), Field Programmable Gate Arrays (FPGAs), etc.

Processor 502 may be disposed in communication with one or more input/output (I/O) devices via I/O interface 503. The I/O interface 503 may employ communication protocols/methods such as, without limitation, audio, analog, digital, monoaural, RCA, stereo, IEEE-1394, serial bus, universal serial bus (USB), infrared, PS/2, BNC, coaxial, component, composite, digital visual interface (DVI), high-definition multimedia interface (HDMI), RF antennas, S-Video, VGA, IEEE 802.11 a/b/g/n/x, Bluetooth, cellular (e.g., code-division multiple access (CDMA), high-speed packet access (HSPA+), global system for mobile communications (GSM), long-term evolution (LTE), WiMax, or the like), etc.

Using the I/O interface 503, the computer system 501 may communicate with one or more I/O devices. For example, the input device 504 may be an antenna, keyboard, mouse, joystick, (infrared) remote control, camera, card reader, fax machine, dongle, biometric reader, microphone, touch screen, touchpad, trackball, sensor (e.g., accelerometer, light sensor, GPS, gyroscope, proximity sensor, or the like), stylus, scanner, storage device, transceiver, video device/source, visors, etc. Output device 505 may be a printer, fax machine, video display (e.g., cathode ray tube (CRT), liquid crystal display (LCD), light-emitting diode (LED), plasma, or the like), audio speaker, etc. In some embodiments, a transceiver 506 may be disposed in connection with the processor 502. The transceiver may facilitate various types of wireless transmission or reception. For example, the transceiver may include an antenna operatively connected to a transceiver chip (e.g., Texas Instruments WiLink WL1283, Broadcom BCM4750IUB8, Infineon Technologies X-Gold 618-PMB9800, or the like), providing IEEE 802.11a/b/g/n, Bluetooth, FM, global positioning system (GPS), 2G/3G HSDPA/HSUPA communications, etc.

In some embodiments, the processor 502 may be disposed in communication with a communication network 508 via a network interface 507. The network interface 507 may communicate with the communication network 508. The network interface may employ connection protocols including, without limitation, direct connect, Ethernet (e.g., twisted pair 10/100/1000 Base T), transmission control protocol/internet protocol (TCP/IP), token ring, IEEE 802.11a/b/g/n/x, etc. The communication network 508 may include, without limitation, a direct interconnection, local area network (LAN), wide area network (WAN), wireless network (e.g., using Wireless Application Protocol), the Internet, etc. Using the network interface 507 and the communication network 508, the computer system 501 may communicate with devices 510, 511, and 512. These devices may include, without limitation, personal computer(s), server(s), fax machines, printers, scanners, various mobile devices such as cellular telephones, smartphones (e.g., Apple iPhone, Blackberry, Android-based phones, etc.), tablet computers, eBook readers (Amazon Kindle, Nook, etc.), laptop computers, notebooks, gaming consoles (Microsoft Xbox, Nintendo DS, Sony PlayStation, etc.), or the like. In some embodiments, the computer system 501 may itself embody one or more of these devices.

In some embodiments, the processor 502 may be disposed in communication with one or more memory devices (e.g., RAM 513, ROM 514, etc.) via a storage interface 512. The storage interface may connect to memory devices including, without limitation, memory drives, removable disc drives, etc., employing connection protocols such as serial advanced technology attachment (SATA), integrated drive electronics (IDE), IEEE-1394, universal serial bus (USB), fiber channel, small computer systems interface (SCSI), etc. The memory drives may further include a drum, magnetic disc drive, magneto-optical drive, optical drive, redundant array of independent discs (RAID), solid-state memory devices, solid-state drives, etc. Variations of memory devices may be used for implementing, for example, the databases disclosed herein.

The memory devices may store a collection of program or database components, including, without limitation, an operating system 516, user interface application 517, web browser 518, mail server 519, mail client 520, user/application data 521 (e.g., program files written based on HDL to describe behaviors of integrated circuit 200 of FIG. 2, an application that translate the HDL into data for configuring a FPGA and/or ASIC fabrication, etc.), etc. The operating system 516 may facilitate resource management and operation of the computer system 501. Examples of operating systems include, without limitation, Apple Macintosh OS X, Unix, Unix-like system distributions (e.g., Berkeley Software Distribution (BSD), FreeBSD, NetBSD, OpenBSD, etc.), Linux distributions (e.g., Red Hat, Ubuntu, Kubuntu, etc.), IBM OS/2, Microsoft Windows (XP, Vista/7/8, etc.), Apple iOS, Google Android, Blackberry OS, or the like. User interface 517 may facilitate display, execution, interaction, manipulation, or operation of program components through textual or graphical facilities. For example, user interfaces may provide computer interaction interface elements on a display system operatively connected to the computer system 501, such as cursors, icons, check boxes, menus, scrollers, windows, widgets, etc. Graphical user interfaces (GUIs) may be employed, including, without limitation, Apple Macintosh operating systems' Aqua, IBM OS/2, Microsoft Windows (e.g., Aero, Metro, etc.), Unix X-Windows, web interface libraries (e.g., ActiveX, Java, Javascript, AJAX, HTML, Adobe Flash, etc.), or the like.

In some embodiments, the computer system 501 may implement a web browser 518 stored program component. The web browser may be a hypertext viewing application, such as Microsoft Internet Explorer, Google Chrome, Mozilla Firefox, Apple Safari, etc. Secure web browsing may be provided using HTTPS (secure hypertext transport protocol), secure sockets layer (SSL), Transport Layer Security (TLS), etc. Web browsers may utilize facilities such as AJAX, DHTML, Adobe Flash, JavaScript, Java, application programming interfaces (APIs), etc. In some embodiments, the computer system 501 may implement a mail server 519 stored program component. The mail server may be an Internet mail server such as Microsoft Exchange, or the like. The mail server may utilize facilities such as ASP, ActiveX, ANSI C++/C#, Microsoft .NET, CGI scripts, Java, JavaScript, PERL, PHP, Python, WebObjects, etc. The mail server may utilize communication protocols such as internet message access protocol (IMAP), messaging application programming interface (MAPI), Microsoft Exchange, post office protocol (POP), simple mail transfer protocol (SMTP), or the like. In some embodiments, the computer system 501 may implement a mail client 520 stored program component. The mail client may be a mail viewing application, such as Apple Mail, Microsoft Entourage, Microsoft Outlook, Mozilla Thunderbird, etc.

In some embodiments, computer system 501 may store user/application data 521, such as the data, variables, records, etc. as described in this disclosure. Such databases may be implemented as fault-tolerant, relational, scalable, secure databases such as Oracle or Sybase. Alternatively, such databases may be implemented using standardized data structures, such as an array, hash, linked list, struct, structured text file (e.g., XML), table, or as object-oriented databases (e.g., using ObjectStore, Poet, Zope, etc.). Such databases may be consolidated or distributed, sometimes among the various computer systems discussed above in this disclosure. It is to be understood that the structure and operation of any computer or database component may be combined, consolidated, or distributed in any working combination.

The specification has described methods and systems for memory initialization of an integrated circuit. The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

What is claimed is:

1. A method for memory initialization in an integrated circuit comprising a field-programmable gate array (FPGA) circuitry configured to emulate an application-specific integrated circuit (ASIC) within the integrated circuit, the method comprising:
   detecting a start of a power-off state for a power domain within the FPGA circuitry including a first memory device;
   decoupling the first memory device of the FPGA circuitry from a logic block of the FPGA circuitry, wherein the decoupling is performed to enable forwarding of one or more write operation related signals generated by a memory initialization block of the FPGA circuitry and disable forwarding of one or more write operation related signals generated by the logic block of the FPGA circuitry;
   performing a write operation to write data of a pre-determined pattern to the first memory device upon detecting the start of the power-off state; and
   providing the data stored at the first memory device for a reading operation after the power-off state ends, wherein the first memory device of the FPGA circuitry is re-coupled with the logic block of the FPGA circuitry.

2. The method of claim 1, where the detecting of the start of the power-off state comprises detecting a transition edge of at least one of: an isolation enable signal, a reset signal, and a power disable signal.

3. The method of claim 1, wherein the FPGA circuitry is configured to emulate a behavior of the ASIC that includes a second memory device, and wherein the pre-determined pattern is configured to emulate a content of the second memory device when a power domain including the second memory device transits from a power-on state to a power-off state.

4. The method of claim 1, further comprising:
   determining a range of addresses associated with memory locations within the first memory device; and
   writing the data to each of the memory locations associated with the range of addresses.

5. The method of claim 4, wherein the data is written to each of the memory locations sequentially.

6. The method of claim 1, wherein the first memory device includes a first port for the reading operation and a second port for the write operation.

7. The method of claim 1, wherein the decoupling further comprises:
configuring one or more circuits of the integrated circuit to forward a reset signal and a clock specific to the integrated circuit to the first memory device; and
blocking the forwarding of a locally generated reset signal and a clock, by a circuit of the one or more circuits, to the first memory device.

8. A first integrated circuit comprising a field-programmable gate array (FPGA) circuitry configured to emulate an application-specific integrated circuit (ASIC) within an integrated circuit, the first integrated circuit configured to:
detect a start of a power-off state for a power domain within the FPGA circuitry including a first memory device;
decouple the first memory device of the FPGA circuitry from a logic block of the FPGA circuitry, wherein the decoupling is performed to enable forwarding of one or more write operation related signals generated by a memory initialization block of the FPGA circuitry and disable forwarding of one or more write operation related signals generated by the logic block of the FPGA circuitry;
perform a write operation to write data of a pre-determined pattern to the first memory device upon detecting the start of the power-off state; and
provide the data stored at the first memory device for a reading operation after the power-off state ends, wherein the first memory device of the FPGA circuitry is re-coupled with the logic block of the FPGA circuitry.

9. The first integrated circuit of claim 8, where the detecting of the start of the power-off state comprises detecting a transition edge of at least one of: an isolation enable signal, a reset signal, and a power disable signal.

10. The first integrated circuit of claim 8, wherein the FPGA circuitry is configured to emulate a behavior of the ASIC that includes a second memory device, and wherein the pre-determined pattern is configured to emulate a content of the second memory device when a power domain including the second memory device transits from a power-on state to a power-off state.

11. The first integrated circuit of claim 8, further configured to:
determine a range of addresses associated with memory locations within the first memory device; and
write the data to each of the memory locations associated with the range of addresses.

12. The first integrated circuit of claim 11, wherein the data is written to each of the memory locations sequentially.

13. The first integrated circuit of claim 8, wherein the first memory device includes a first port for the reading operation and a second port for the write operation.

14. A non-transitory computer-readable medium that stores a set of programming instructions that configure a field-programmable gate array (FPGA) circuitry configured to emulate an application-specific integrated circuit (ASIC) within an integrated circuit, to perform a method for memory initialization at the FPGA circuitry, the method comprising:
detecting a start of a power-off state for a power domain within the FPGA circuitry including a first memory device;
decoupling the first memory device of the FPGA circuitry from a logic block of the FPGA circuitry, wherein the decoupling is performed to enable forwarding of one or more write operation related signals generated by a memory initialization block of the FPGA circuitry and disable forwarding of one or more write operation related signals generated by the logic block of the FPGA circuitry;
performing a write operation to write data of a pre-determined pattern to the first memory device upon detecting the start of the power-off state; and
providing the data stored at the first memory device for a reading operation after the power-off state ends, wherein the first memory device of the FPGA circuitry is re-coupled with the logic block of the FPGA circuitry.

15. The non-transitory computer readable medium of claim 14, where the detecting of the start of the power-off state comprises detecting a transition edge of at least one of: an isolation enable signal, a reset signal, and a power disable signal.

16. The non-transitory computer readable medium of claim 14, wherein the FPGA circuitry is configured to emulate a behavior of the ASIC that includes a second memory device, and wherein the pre-determined pattern is configured to emulate a content of the second memory device when a power domain including the second memory device transits from a power-on state to a power-off state.

17. The non-transitory computer readable medium of claim 14, wherein the method further comprises:
determining a range of addresses associated with memory locations within the first memory device; and
writing the data to each of the memory locations associated with the range of addresses.

18. The non-transitory computer readable medium of claim 17, wherein the data is written to each of the memory locations sequentially.

* * * * *